(12) United States Patent
Beimel et al.

(10) Patent No.: US 7,203,328 B2
(45) Date of Patent: Apr. 10, 2007

(54) HEARING AID, AND METHOD FOR REDUCING FEEDBACK THEREIN

(75) Inventors: Bernd Beimel, Erlangen (DE); Tom Weidner, Erlangen (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 502 days.

(21) Appl. No.: 10/445,608

(22) Filed: May 27, 2003

(65) Prior Publication Data

US 2004/0037443 A1    Feb. 26, 2004

(30) Foreign Application Priority Data

May 27, 2002    (DE)    ................................. 102 23 544

(51) Int. Cl.
*H04R 25/00* (2006.01)
*H04B 15/00* (2006.01)

(52) U.S. Cl. ......................................... 381/318; 381/93

(58) Field of Classification Search ................ 381/318, 381/83, 93, 331
See application file for complete search history.

(56) References Cited

U.S. PATENT DOCUMENTS

| 5,710,820 | A | * | 1/1998 | Martin et al. ............... 381/321 |
| 6,097,823 | A | | 8/2000 | Kuo |
| 6,181,794 | B1 | * | 1/2001 | Park et al. ............. 379/406.08 |
| 2002/0061113 | A1 | | 5/2002 | van Halteren et al. |
| 2003/0133579 | A1 | * | 7/2003 | Danielsen et al. .......... 381/318 |

FOREIGN PATENT DOCUMENTS

| DE | 1 126 929 | 4/1962 |
| DE | 28 54 912 | 6/1979 |
| EP | 0 579 152 | 7/1993 |
| EP | 1 119 218 | 7/2001 |

OTHER PUBLICATIONS

Patent Abstracts of Japan Publication No. 09018998 for Japanese Application No. 07163850.

* cited by examiner

*Primary Examiner*—Sinh Tran
*Assistant Examiner*—Walter F Briney, III
(74) *Attorney, Agent, or Firm*—Schiff Hardin LLP

(57) ABSTRACT

Feedback reduction in hearing aids is simplified and improved in an amplification device that has two separate compensation paths, an acoustic input and an inductive input. In the first compensation path, a first filter device acts to compensate acoustic feedback, and in the second compensation path, a second filter device acts to compensate inductive feedback. The two very different feedbacks can be individually compensated without increased outlay.

9 Claims, 1 Drawing Sheet

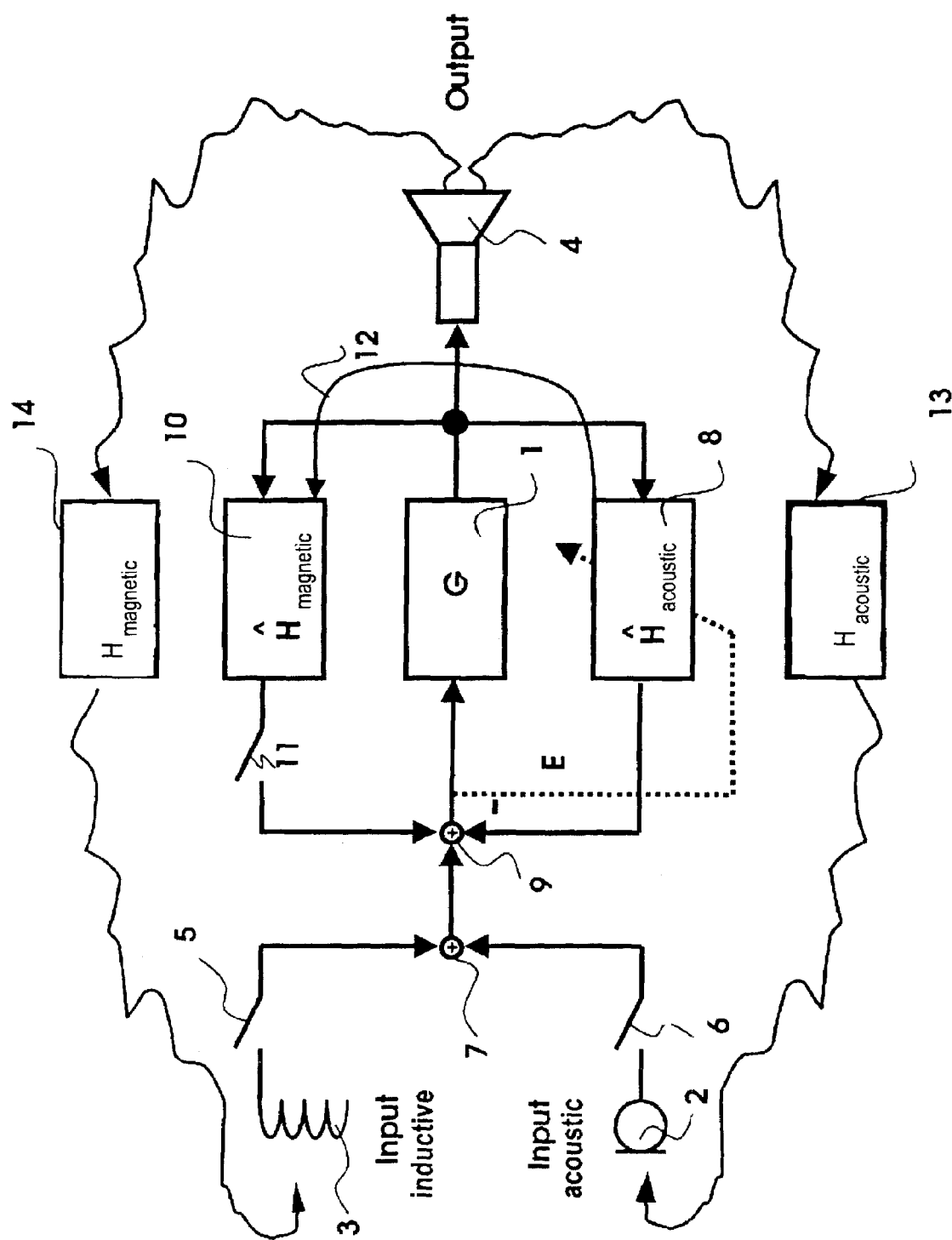

HEARING AID, AND METHOD FOR REDUCING FEEDBACK THEREIN

BACKGROUND OF THE INVENTION

1. Field of the Invention

The present invention concerns an amplifier circuit for hearing aids of the type having an amplification device with an input at which acoustically-generated signals and inductively-generated signals are present, and a filter device that is connected to the amplification device for compensation of an acoustic feedback by adaptation to the acoustic feedback. In addition, the present invention concerns a hearing aid with such an amplifier circuit. Furthermore, the present invention concerns a corresponding method for the amplification of input signals of a hearing aid.

2. Description of the Prior Art

In a hearing aid, acoustic input signals are acquired by a microphone, amplified in an amplification device, and the amplified signals are supplied to a speaker (earphone). The sound emitted from the speaker is partially fed back to the microphone, resulting in noticeable interference.

Besides the microphone and the speaker, a hearing aid often also has a telecoil for the inductive infeed of auditory signals, for example from a telephone. Since the speaker operates electromagnetically, it normally causes a magnetic feedback at the telecoil from the magnet of the speaker.

In mixed mode, the microphone and the telecoil are simultaneously operated, and a number of input signals exist. Correspondingly, a number of feedback paths are also created in the mixed mode.

In this context, a device for electromagnetically reducing feedback in communications devices is known from the European Application EP 1 119 218 A1. A digital filter is used in order to simulate the combined pulse response of the components of the D/A converter, speaker, electromagnetic feedback path, pick-up coil, and A/D converter. The coefficients of the digital filter are adjusted or set according to a selected feedback estimation algorithm.

SUMMARY OF THE INVENTION

An object of the present invention is to improve and simplify feedback reduction in hearing aids.

This object is achieved in accordance with the invention in an amplifier circuit for hearing aids having an amplification device with an input at which acoustically-generated signals and inductively-generated signals are present, and a first filter device that is connected to the amplification device for compensation of acoustic feedback, as well as a second filter device that is connected to the amplification device and separate from the first filter device, for compensation of inductive feedback.

The object is also achieved in a method for the amplification of input signals for a hearing aid, by providing acoustic and inductive input signals and compensating acoustic feedback by means of a first filter device, as well as compensating an inductive feedback by means of a second filter device.

The basis of the invention is to compensate a number of feedback paths with a number of compensation paths. Conventional feedback reduction methods in hearing aids operate only with one internal compensation path. These methods are based on only one feedback path. Approaches or methods have not been pursued or presented, that are concerned with the simultaneous compensation(feedback reduction) of a number of simultaneously active feedback paths by means of a number of compensation paths, wherein one of the active feedback paths may not be acoustic.

With the present invention, it is possible to adequately react to a number of feedback paths that may possibly carry different input signals. Inventively, separate feedback compensation or reduction is provided for each of the various paths. Specifically, the problem of operating the telephone can well solved in a satisfactory manner by its own compensation filter. In particular, inductive feedback can be compensated by a static filter, and acoustic feedback can be compensated by an adaptive filter.

The relatively expensive and elaborate earphone encapsulations can be dispensed with, the assembly of the telecoil is subject to fewer limitations, as a result of compensation of the magnetic feedback. Moreover, the invention makes it possible to simulate the telecoil path with an existing adaptive compensation filter, to subsequently read out the coefficients thereof, and to use these as a preset for a second static- though slow-adapting compensation filter. Consequently, the actual adaptive compensator remains almost completely free for another, preferably acoustic, path. Thus, a number of mostly independent feedback paths are analyzed, especially in the context of non-acoustic paths, in the inventive device and in the inventive method, and used for compensation.

DESCRIPTION OF THE DRAWINGS

The single FIGURE is a schematic circuit diagram of the inventive amplifier circuit.

DESCRIPTION OF THE PREFERRED EMBODIMENTS

An amplification device 1 is circuited between a microphone 2 and a telecoil or telephone coil 3 on one side and speaker 4 on the other side. Thus, the hearing aid has an inductive input and an acoustic input. Acoustic and magnetic output signals are generated by the speaker 4.

The telecoil 3 can be disconnected from the amplification device 1 by a first switch 5. In the same manner, the microphone 2 can be separated from the amplification device 1 by a second switch 6. The signals of the telecoil 3 and the microphone 2 are merged in an adder 7 and supplied to the amplification device 1. Alternatively, the signals can also be amplified separately and subsequently added.

The output signal of the amplification device 1 is fed back via an adaptive filter 8 to its input. In an adder 9, the feedback signal of the adaptive filter 8 is subtracted from the summed signal of the adder 7. The adaptive filter 8 is adapted continuously to the conditions of the acoustic environment on the basis of the summed signal E of the adder 9.

Furthermore, the output signal of the amplification device 1 is fed back via a static filter 10 to its input. This feedback signal is also subtracted from the summed signal of the adder 7 in the adder 9. A third switch 11 enables the deactivation of the feedback path of the static filter 10.

There is a data connection 12 to the adaptive filter 8 for setting or adjusting the filter coefficients in the second static filter 10.

Sound is emitted by the speaker 4 and is fed back into the microphone 2 via an acoustic feedback path 13 that has a transfer function $H_{acoustic}$. In the same manner, a magnetic field emitted by speaker 4 is fed back into the telecoil 3 via a magnetic feedback path 14, which has a transfer function $H_{magnetic}$. As a result of the adaptation, the adaptive filter 8 has a transfer function $\hat{H}_{acoustic}$, and the static filter 10 has a transfer function $\hat{H}_{magnetic}$, so that both feedback signals can be appropriately compensated by the acoustic path 13 and the magnetic path 14.

The reason for the use of an adaptive filter 8 and a simple static filter 10 is that the second static filter 10 can be fashioned less elaborately, since the magnetic feedback path is less dynamic than the acoustic feedback path. The magnetic feedback is normally constant, whereas the acoustic feedback can be varied merely by the hearing aid user putting his/her hand to his/her ear. It is therefore beneficial to differentiate between the magnetic feedback path and the acoustic feedback path, and use filters that differ in complexity for each.

Moreover, there is a transit time delay between the acoustic feedback and the magnetic feedback that must be taken into account for in the filter compensation. Furthermore, the acoustic feedback is centered in a higher frequency range than the magnetic feedback. It is also for this reason that different compensation paths are used for each feedback. A single filter for both compensations would clearly be much more elaborate than each of the individually described filters 8 and 10.

Although it is possible to use an adaptive filter for each of the filters 8 and 10, a static filter suffices for compensation of the magnetic feedback, due to the minimal dynamics in the magnetic feedback path.

The adjustment or setting of the filter coefficients now will be described in more detail. The filter system has, as stated above, at least one microphone 2, a telecoil 3, an amplification device 1, and an earphone or speaker 4. Furthermore, it has at least one adaptive feedback compensation filter 8 and an adaptive or static feedback compensation filter 10. During production of the device, or during customization, telephone coil operation is switched on and all other signal inputs are disconnected. For this, the second switch 6 and the third switch 11 are opened and the first switch 5 is closed. Consequently, the adaptive filter 8 is confronted only with the magnetic feedback path 14. For adjustment, only the gain of the amplification device 1 is increased, until the device feeds back, or is set just short of feeding back. The adaptive feedback compensation filter 8 is thereupon activated, until it has suppressed the feedback. The adaptation is thus stopped and the coefficients are either stored in the device, or sent via a transmission path to or from a customization computer as pre-settings for the second feedback compensation filter 10 located in the hearing aid. This can—as already mentioned—be adaptive as well. When the telephone coil is switched on during normal operation, then the second, now optimally preset compensation filter 10 is activated. This effectively compensates the magnetic feedback path 14, and the actual adaptive system can be used unrestricted for the acoustic feedback path.

The adaptation of the adaptive filter 8 to the acoustic feedback path 13 continuously ensues during microphone operation. Consequently, the switches 5 and 11 are opened while the switch 6 is closed.

In mixed mode, i.e., during operation of the microphone 2 and the telecoil 3 for pick-up of input signals, all switches 5, 6, and 11 are closed. In this condition, the adaptive filter 8 compensates the acoustic feedback path 13, and the static filter 10 compensates the magnetic feedback path 14.

Although modifications and changes may be suggested by those skilled in the art, it is the intention of the inventors to embody within the patent warranted hereon all changes and modifications as reasonably and properly come within the scope of their contribution to the art.

We claim as our invention:

1. An amplifier circuit for a hearing aid, comprising:
   an amplification device having an input at which acoustically-generated signals and inductively-generated signals are present;
   a first filter device operating with first filter coefficients connected in a first feedback path to said amplification device for compensating acoustic feedback in said first feedback path;
   a first switch connected to said input for selectively connecting and disconnecting said acoustically-generated signals to and from said input
   a second filter device, different from said first filter device and operating with second filter coefficients, connected in a second feedback path to said amplification device for statically compensating inductive feedback in said second feedback path; and
   a second switch connected between said input and said second filter device for connecting and disconnecting said second filter device to and from said input, said first switch being operable to disconnect said input from said acoustically-generated input signal while said second switch is operated to interrupt said second feedback oath for calibration of said second filter device.

2. An amplifier circuit as claimed in claim 1 wherein said first filter device operates in a first frequency range and wherein said second filter device operates in a second frequency range, said first and second frequency ranges being different from each other.

3. An amplifier circuit as claimed in claim 1 further comprising a third switch connected to said input for selectively connecting and disconnecting said inductively-generated signals to and from said input.

4. A hearing aid comprising:
   an inductive sensor;
   an acoustic sensor;
   an amplification device having an input connected to receive signals from said inductive sensor and signals from said acoustic sensor, and having an output;
   a speaker connected to said output;
   a first filter device, operating with first filter coefficients connected across said input and said output of said amplification device in a first feedback path for compensating acoustic feedback in said first feedback path;
   a first switch connected to said input for selectively connecting and disconnecting said acoustically-generated signals to and from said input
   a second filter device, operating with second filter coefficients connected across said input and said output of said amplification device in a second feedback path for compensating inductive feedback in said second feedback path; and
   a second switch connected between said input and said second filter device for connecting and disconnecting said second filter device to and from said input, said first switch being operable to disconnect said input from said acoustically-generated input signal while said second switch is operated to interrupt said second feedback path for calibration of said second filter device.

5. A method for amplifying input signals in a hearing aid, comprising the steps of:
   operating a hearing aid in an acoustic mode wherein acoustically-generated signals are supplied to an input of an amplification device and are amplified therein;

operating said hearing aid in an inductive mode wherein inductively-generated signals are supplied to the input of the amplification device and are amplified therein;

in said acoustic mode, compensating acoustic feedback in a first feedback path of said hearing aid with a first filter device connected to said amplification device;

in said inductive mode, compensating inductive feedback in a second feedback path of said hearing aid with a second filter device different from said first filter device, connected to said amplification device; and statically compensating said inductive feedback with said second filter device, and disconnecting said input from said acoustically-generated input signal and interrupting said second feedback path for calibration of said second filter device.

6. A method as claimed in claim 5 comprising adaptively compensating said acoustic feedback with said first filter device.

7. A method as claimed in claim 5 wherein said first filter device and said second filter device operate using filter coefficients, and comprising determining said filter coefficients for said first filter device before said compensation of said acoustic feedback, and transmitting said filter coefficients from said first filter device to said second filter device for said calibration of said second filter device.

8. A method as claimed in claim 5 comprising compensating acoustic feedback in a first frequency range in said first filter device and compensating inductive feedback in a second frequency range in said second filter device, said first and second filter ranges differing from each other.

9. A method as claimed in claim 5 comprising adaptively compensating said acoustic feedback with said first filter device, and disconnecting said input from said inductively-generated signals and interrupting said second feedback path for adaptation of said first filter device.

* * * * *